US005252968A

United States Patent [19]
Donovan

[11] Patent Number: 5,252,968
[45] Date of Patent: * Oct. 12, 1993

[54] APPARATUS AND METHOD FOR OPTICAL ENCODING AND CURSOR CONTROL TRACKBALL

[75] Inventor: Paul M. Donovan, Menlo Park, Calif.

[73] Assignee: Apple Computer, Inc., Cupertino, Calif.

[*] Notice: The portion of the term of this patent subsequent to Jun. 25, 2008 has been disclaimed.

[21] Appl. No.: 809,837

[22] Filed: Dec. 17, 1991

Related U.S. Application Data

[63] Continuation of Ser. No. 664,480, Mar. 4, 1991, abandoned, which is a continuation of Ser. No. 357,419, May 24, 1989, abandoned.

[51] Int. Cl.$^5$ .................. G01D 5/34; G08C 17/00
[52] U.S. Cl. .............. 390/870.28; 250/231.18; 250/231.14; 340/165
[58] Field of Search ............... 340/870.28, 710, 709, 340/706, 870.29, 870.19, 809, 810; 250/231.18, 231.14, 231.16; 341/112, 178, 20

[56] References Cited

U.S. PATENT DOCUMENTS

| | | | |
|---|---|---|---|
| Re. 27,723 | 12/1967 | Stewart, Jr. | 340/870.29 |
| Re. 32,632 | 2/1988 | Atkinson | 340/710 |
| Re. 32,633 | 3/1988 | Hovey et al. | 340/710 |
| 4,212,000 | 7/1980 | Yamada . | |
| 4,281,325 | 7/1981 | Jarva | 340/870.29 |
| 4,316,262 | 2/1982 | Mizuta et al. | 340/870.19 |
| 4,354,102 | 10/1982 | Burns et al. . | |
| 4,464,652 | 8/1984 | Lapson et al. . | |
| 4,496,936 | 1/1985 | Kramer | 250/231 S E |
| 4,533,830 | 8/1985 | Beauprey | 250/231 SE |
| 4,634,859 | 1/1987 | Martell . | |
| 4,683,472 | 7/1987 | Beling | 340/870.29 |
| 4,704,523 | 11/1987 | Uchida | 250/231.16 |
| 4,717,883 | 1/1988 | Browning . | |
| 4,728,788 | 3/1988 | Myers et al. | 250/231 S E |
| 4,782,327 | 11/1988 | Kley et al. | 341/20 |
| 4,789,836 | 12/1988 | May . | |
| 4,983,826 | 1/1991 | Hayase et al. | 250/231.18 |
| 5,008,528 | 4/1991 | Duchon | 340/709 |
| 5,027,109 | 6/1991 | Donovan et al. | 340/710 |

FOREIGN PATENT DOCUMENTS 2185812 7/1987 United Kingdom .

Primary Examiner—Donald J. Yusko
Assistant Examiner—John Giust
Attorney, Agent, or Firm—Blakely, Sokoloff, Taylor & Zafman

[57] ABSTRACT

An apparatus for optical encoding. An electrical input circuitry is provided for providing a pulsed electrical input signal. A light source circuitry is connected to the pulsed electrical input circuitry for utilizing the pulsed electrical input signal to produce pulses of light. Light collecting and electrical conducting circuitry is provided and synchronized with the light source circuitry. The light collecting and electrical conducting means is positioned in relation to the light source circuitry for receiving and being responsive to light produced by the pulsed light source circuitry. An electrical output signal is produced, indicating such a response. Positionable light interrupting circuitry is provided for opening and closing the optical path of light being transmitted from the light source circuitry to the light collecting and electrical conducting circuitry. The opening and closing affects the electrical output signal, the resulting pulsed electrical output signal for use in encoding. The apparatus results in minimized power consumption as a result of the pulsed synchronization of the light source circuitry and the light collecting and electrical conducting circuitry. The present invention is particularly adaptable for use with cursor control devices for computer controlled display systems.

8 Claims, 6 Drawing Sheets

APPARATUS AND METHOD FOR OPTICAL ENCODING AND CURSOR CONTROL TRACKBALL

This is a continuation of application Ser. No. 07/664,480, filed Mar. 4, 1991, now abandoned, which was a continuation of application Ser. No. 07/357,419, filed May 24, 1989, now abandoned.

BACKGROUND OF THE INVENTION

1. Field of the Invention

The present invention relates to optical encoders and more particularly to an apparatus for optical encoding which minimizes power consumption and is particularly adaptable for use with cursor control devices for computer controlled display systems.

2. Description of the Related Art

In many computer controlled display systems, it is desirable to allow the user to control the position of a cursor or the like by means which are external from the main computer keyboard. For example, a user may be required to repetitively choose software options displayed on a cathode ray tube (CRT), or may desire to input data in a diagram format into the computer system. In such situations, traditional keyboard input systems are not as effective as cursor control devices each commonly referred to as a "mouse" or a "trackball".

Some cursor control devices presently used have contacting encoders with radially extending conducting arms attached to an encoding wheel. The arms contact stationary brushes for closing an electrical circuit in response to the cursor control device movement.

However, most prior art methods for detecting movement of the cursor control device include optical encoding means. Such optical encoders minimize the amount of mechanical movement and contact between mechanical parts and are therefore, in that aspect, less vulnerable to wear.

Examples of prior art cursor control devices utilizing optical encoding means are provided in U.S. Pat. No. Re. 32,633, issued to D. Hovey, entitled "Cursor Control Device" and U.S. Pat. No. Re. 32,632, issued to W. D. Atkinson, entitled "Display System". Both the '632 and '633 patents are assigned to the present assignee.

Most optical encoders presently in use utilize at least one light emitting diode (LED) in conjunction with two open collector phototransistors, the LEDs transmitting photons to the bases of the phototransistors, allowing the phototransistors to conduct. Typically, an encoding disc (i.e. aperture wheel) is provided with radially spaced slits to alternately provide or interrupt passage of light to the phototransistors as the encoding disc moves in association with movement of the cursor control device. Thus, a scheme is created to either provide the dual phototransistors in dual off states, off-on states, on-off states or dual on states. The variations in these states provide indications of movement of the cursor control device. The LEDs utilized in the prior art methods are in a constant on-state during utilization of the cursor control device, resulting in constant power consumption.

With the advent of more portable computers, such as laptop computers, the need for cursor control devices which require lower power consumption has become acute. As will be disclosed below, present applicant has developed a novel apparatus and method for minimizing power consumption in such cursor control devices, with general applications where optical encoding is required.

SUMMARY OF THE INVENTION

An apparatus for optical encoding is disclosed. An electrical input means is provided for providing a pulsed electrical input signal. A light source means is connected to the pulsed electrical input means for utilizing the pulsed electrical input signal to produce pulses of light. Light collecting and electrical conducting means are provided and synchronized with the light source means. The light collecting and electrical conducting means are positioned in relation to the light source means for receiving and being responsive to light produced by the pulsed light source means. An electrical output signal is produced, indicating such a response. Positionable light interrupting means is provided for opening and closing the optical path of light being transmitted from the light source means to the light collecting and electrical conducting means. The opening and closing affects the electrical output signal, the resulting pulsed electrical output signal for use in encoding. The apparatus results in minimized power consumption as a result of the pulsed synchronization of the light source means and the light collecting and electrical conducting means. The present invention is particularly adaptable for use with cursor control devices for computer controlled display systems.

BRIEF DESCRIPTION OF THE DRAWINGS

The same elements or parts throughout the figures of the drawings are designated by the same reference characters.

DETAILED DESCRIPTION OF THE INVENTION

I. General Configuration

Figure 1:
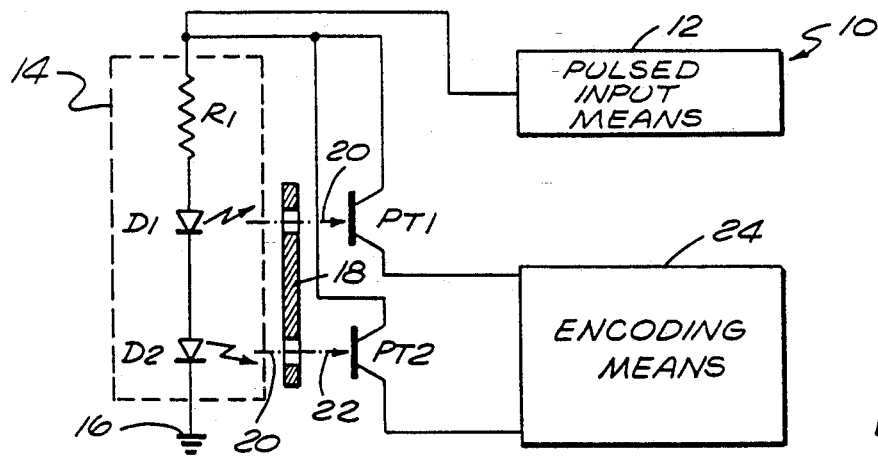
FIG. 1 is a functional and circuit diagram representing the encoding scheme of the present invention.

Referring now to the drawings and the characters of reference marked thereon, FIG. 1 illustrates a schematic diagram of the apparatus for optical encoding, designated generally as 10. A pulsed electrical input means 12 is provided for generating a pulsed electrical signal. Such an input means may be, for example, an integrated circuit or an analog device. The apparatus 10 may be utilized in various encoding applications where low power is desired and a counting scheme is required. For example, it may be used in a cursor control device for a computer, in a hand-held text scanner or in a sensor for detecting articles on manufacturing assembly lines.

The pulsed input means 12 is connected to a light source means, shown in dashed lines designated 14. The light source means 14 includes a serial connection of a current limiting resistor R1, light emitting diode D1, and light emitting diode D2. (The order of these components is not critical.) The light source means 14 is connected to ground 16.

Two phototransistors PT1, PT2 are also connected to the pulsed input means 12, as shown. These 2 phototransistors PT1, PT2 are positioned in relation to the diodes D1, D2 so as to be capable of collecting light being emitted from the diodes.

Positionable light interrupting means 18 which may be, for example, an encoding aperture wheel, as in the case of a cursor control device, as will be described below.

The light interrupting means 18 opens and closes the optical paths of the light beams 20, 22 emitted from the diodes D1, D2. The resulting pulsed output of the light collecting and conducting means PT1, PT2 is transmitted to encoding means 24 and can be utilized for encoding. The encoding means 24 may, for example, be a portion of the same integrated circuit which produces the pulsed input, as will be disclosed below. The apparatus 10 results in minimized power consumption as a result of the pulsed synchronization of the light source means 14 and the phototransistors PT1, PT2.

As noted, in prior art methods, wherein just the LEDs are pulsed, if the phototransistors are turned on (charged up) by light from the pulsing LEDs, then when the pulsing LEDs go back to 0 volts, the phototransistors discharge slowly depending on the RC time constant. If the discharging phototransistors do not discharge before the next pulse, they can cause mistakes in the counting method used for encoding. The present invention is advantageous because once the pulsing LEDs go to 0 volts, the phototransistors also go to 0 volts and do not have to discharge. Thus, the phototransistors are ready for the next pulse.

II. Cursor Control Device

As previously noted, the inventive concepts disclosed above are particularly adaptable for use with cursor control devices for computers. A specific implementation of such a use is illustrated in FIG. 2.

Figure 2:
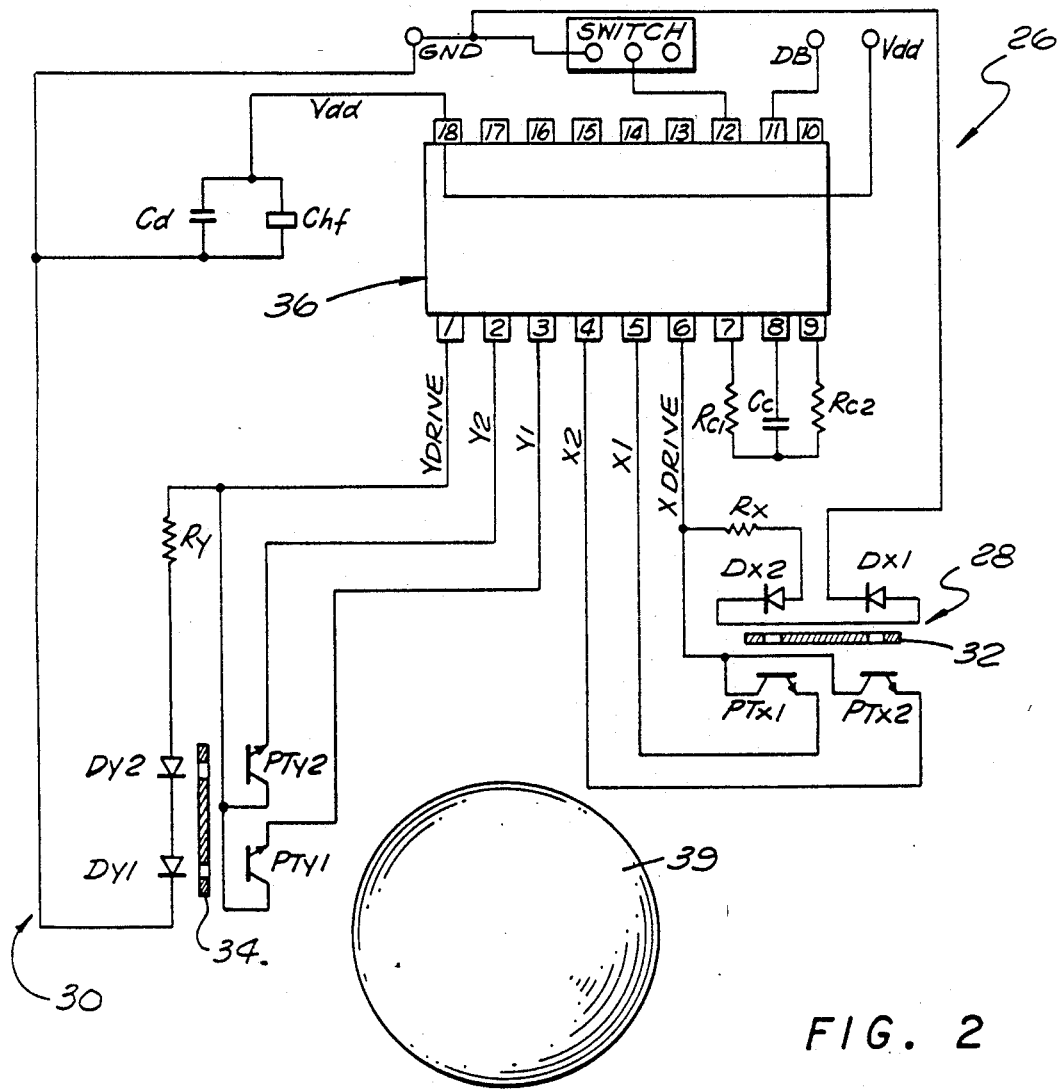
FIG. 2 is a schematic top view of a cursor control device implementing the encoding scheme illustrated in FIG. 1.

Referring now to FIG. 2, which is a schematic illustration of a top view of a mouse design developed by present assignee, it can be readily seen that the cursor display device, designated generally as 26, includes a first optical encoding assembly 28, for encoding along the horizontal or X-axis, and a second optical encoding assembly 30, for optically encoding along the Y-axis. Each optical encoding assembly is structured the same as the apparatus 10, illustrated in FIG. 1.

Positionable light interrupting means are designated as 32, 34 and represent aperture wheel assemblies, also known in the art as encoder disc assemblies. The encoder disc assemblies 32, 34 are provided to convert the movement of the cursor control device 26 into signals indicative of X-Y locations defined on the display system of the computer. The optical encoding assemblies 28, 30 receive signals from, and return signals to, an integrated circuit, designated generally as 36, in response to movement of a ball 39, as will be disclosed below.

Figure 3:
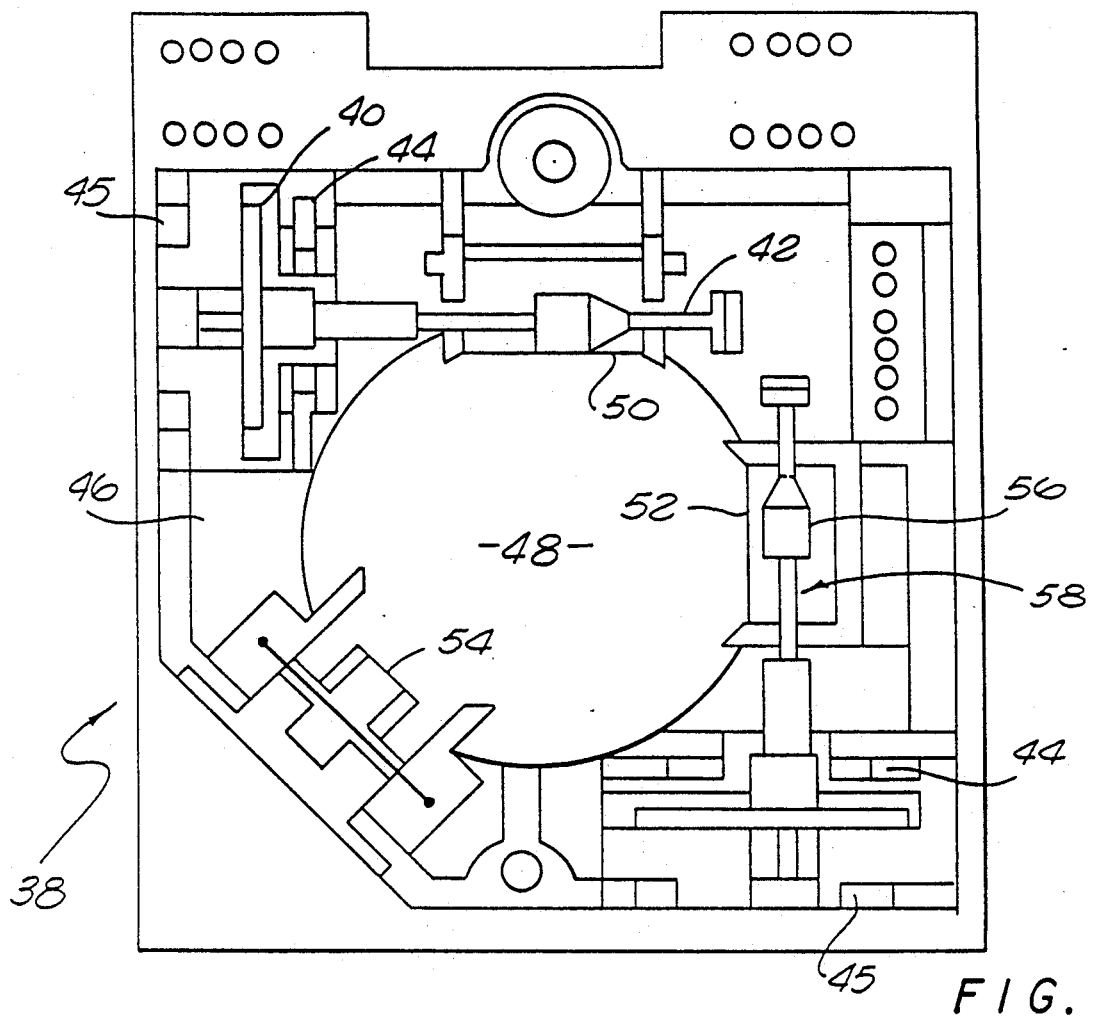
FIG. 3 is a top view of a cursor control device illustrating the mechanical aspects of the present encoding scheme.
Figure 5:
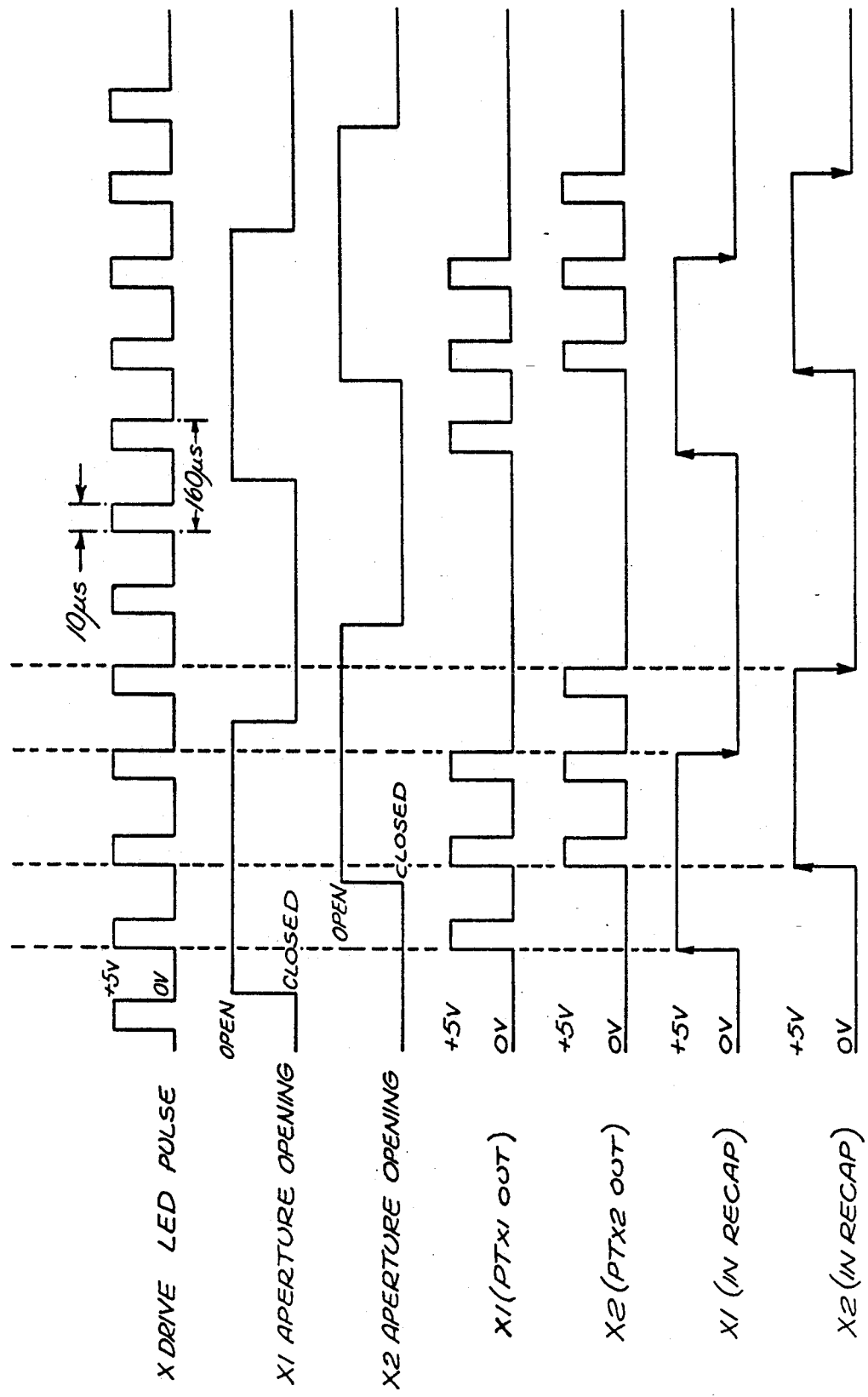
FIG. 5 is a diagrammatical illustration of sample wave forms produced by the present invention, including quadrature outputs of the present invention, indicative of X locations on a display system.

Referring now to FIG. 3, which is essentially a reproduction of FIG. 5 of U.S. Pat. No. Re. 32,632, entitled "Display System" issued to W. D. Atkinson and of U.S. Pat. No. Re. 32,633, issued to D. Hovey, et al., entitled "Cursor Control Device", a top view of the mechanical features of a mouse 38 are illustrated. Both the '632 and '633 patents are assigned to the present assignee. The subject matter in those patents is hereby incorporated by reference.

Briefly, referring to FIG. 3, each encoder assembly includes an aperture wheel or encoder disc 40 coupled to a roller shaft 42. In addition, each encoder disc 40 is provided with a plurality of radially disposed slots (described below) which interrupt the light beams generated by the LEDs or photoemitters 44 which are being transmitted to the photodetectors 45. The frame 46 of the cursor control device 38 is provided with a domed housing 48 having three cut-out locations 50, 52, and 54. As illustrated, cut-outs 50 and 52 are disposed substantially at 90° with respect to one another, with cut-out 54 being oriented generally symmetrically opposite the other cut-outs. A cylindrical contact member 56 surrounds each roller shaft 42 at each respective cut-out location, as illustrated. Each encoder disc assembly 58 is mounted on the frame 46 in a manner allowing rotation of the roller shaft 42 and encoder disc 40 with a minimum of friction. In operation, a ball is disposed within the dome 48 of the frame 46, and retains such that it is maintained in contact with both cylindrical contact members 56. The rotation of the ball within the dome 48 in turn causes the rotation of each roller shaft 56 and its respective encoder disc 40. The beam interruptions from the rotation of each encoder disc 40 produce signal pulses representing increments of motion, while the order in which the light beams are interrupted indicates the direction of motion of the cursor control device 38.

Figure 4:
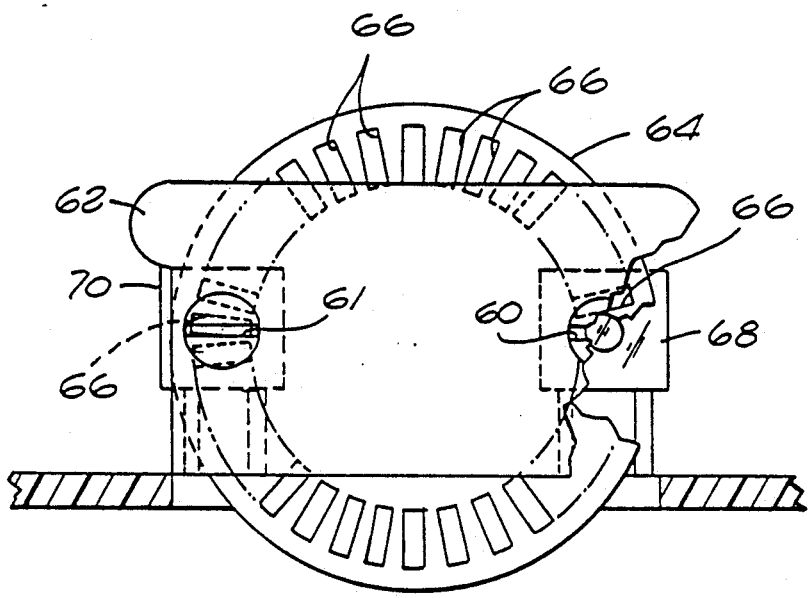
FIG. 4 is a diagrammatical illustration, partially cut away, of the alignment of the photodetectors in relation to the encoder disc and mask encoder.

In the most current versions of the mouse used by Apple Computer, Inc., the aperture or encoder disc is positioned behind a stationary board or mask encoder having two openings, one for each LED/photodetector combination. Referring now to FIG. 4, such an arrangement is illustrated. This figure is from the point of view of the photoemitters. The light travels through slitted openings 60, 61 in stationary mask encoder 62. The encoder disc 64 is positioned to receive the light transmitted through the openings 60, 61 and to either transmit the light through slots 66 to the photodetectors 68, 70 or to interrupt the light. The mask encoder 62 is provided to allow light to be transmitted through only one slit 66 at a time for each photodetector. The photodetectors 68, 70 are disposed such that if one detector is fully exposed by a slot 66 of the encoder disc 64, the other detector is only partially exposed, ideally half exposed. Thus, in addition to the increments of motion of the cursor control device over a surface, the direction of motion may also be determined. Assume, for the sake of example, that the cursor control device 38 is being moved over a surface at a constant speed along the X-direction. Referring now to FIG. 5, a sample output, $X_{drive}$, from the integrated circuit chip 36 to the LEDs ($D_{x1}$, $D_{x2}$) is illustrated. Each LED pulses at a rate of $160 \pm 25$ $\mu S$ with a pulse width of 10 $\mu S$. The graphs, designated X1 and X2 aperture openings, therefore show equally spaced, but displaced, open and closed regions, with respect to time.

The graphs, X1 ($PT_{x1\ out}$) and X2 ($PT_{x2\ out}$), illustrate the electrical signals into the integrated circuit 36. The electrical signals from the photodetectors $PT_{x1}$, $PT_{x2}$ are then converted to electrical quadrature signals by integrated circuit 36 shown by graphs X1 (in Recap) and X2 (in Recap). Such quadrature signals are utilized by the integrated circuit in its counting scheme to detect cursor control movement.

It is noted that if there is little movement of the cursor control unit along the Y-axis, little change will occur on the Y channels inasmuch as the Y encoder disc is not being rotated significantly. The computer display system is provided with appropriate software or hardware, for example, edge detectors to detect signal state transitions. Thus, the signals from each pair of channels may be decoded such that the X-Y direction of motion may be determined for the particular order of transition changes from each channel along an axis.

As previously noted, the pulsed synchronization of the photoemitters and photodetectors for each channel results in minimized power consumption. Furthermore, in the preferred embodiment, the integrated circuit 36 generates inputs, $X_{drive}$ and $Y_{drive}$, which are approximately 180° out of phase. Therefore, power consumption is further minimized by minimizing the peak power consumption.

III. Application Specific Integrated Circuit

Referring back now to FIG. 2, it is noted that the integrated circuit 36 utilized is an application specific integrated circuit (ASIC). The ASIC 36 performs the on-board functions of an encoding mouse or trackball and transmits the results over a bus to a controlling CPU. As noted, the lowest practical power consumption is desired. The ASIC is capable of driving the light source means in a pulsed mode to achieve this goal. Use of a pulsed mode limits the current.

Pin 1 provides the Y pulse drive (vertical) and is connected directly to the collectors of the Y photoemitters $PT_{y1}$ and $PT_{y2}$. The Y pulse drive is also connected to a resistor $R_y$ which feeds the Y LEDs $D_{y1}$, $D_{y2}$.

Pin No. 2 is the Y2 input pin and is used for detecting a phototransistor input signal generated during a vertical movement of the cursor control device. Pin No. 3 is a Y1 input pin which is also used for detecting a phototransistor input signal generated during such a vertical movement of the cursor control device.

Pins 4 and 5 are the X2 input pin and the X1 input pin, respectively, used for detecting a phototransistor input signal generated during a horizontal movement of the cursor control device.

Pin No. 6 is for the X pulse drive (horizontal) and is connected directly to the collectors of the X phototransistors $PT_{x1}$, $PT_{x2}$. The $X_{drive}$ is also connected to a resistor $R_x$ which feeds the photoemitters $D_{x1}$, $D_{x2}$.

Pin No. 7 is an input pin used as a feedback for resistor $R_{c1}$ for the oscillator clock. Pin No. 8 is an output pin connected to a capacitor $C_c$ which is used for the oscillator. Pin No. 9 is an output pin connected to an external timing resistor $R_{c2}$ used for the oscillator.

Pin No. 10 is connected to ground.

Pin No. 11 is connected to an input/output line for the data bus, DB, to and from the CPU.

Pin No. 12 is connected to a switch input, currently used.

Pin No. 13 is for a second switch input.

Pins Nos. 14 to 17 are used for test purposes.

Pin No. 18 is used as the power input, $V_{dd}$, to the ASIC. A decoupling capacitor $C_d$ and high frequency capacitor $C_{hf}$ are utilized for stabilizing the power input line.

Table 1 provides illustrative component values for the components shown in FIG. 2.

TABLE 1

| | |
|---|---|
| $R_x$, $R_y$ | 1 kΩ ± 5% |
| $C_c$ | 10 pf ± 5% |
| $C_d$ | 0.1 μf |
| $C_{hf}$ | 1.0 μf |
| $D_{x1}$, $D_{x2}$, $D_{y1}$, $D_{y2}$ | Omron EEL 104 HB |
| $R_{c1}$ | 56.2 kΩ ± 1% |
| $R_{c2}$ | 22.1 kΩ ± 1% |
| $R_{c1}$, $R_{c2}$ & $C_c$ oscillator | comprise an 800 Khz clock |
| $PT_{x1}$, $PT_{x2}$, $PT_{y1}$, $PT_{y2}$ | EETP 104 HB |
| $V_{dd}$ | 5 V |
| Pulse Characteristics | |
| X, $Y_{drive}$ | pulse width 10 μs period 160 μs ± 16% |

It is also noted that the inputs to Pins Nos. 2–5 include internal 70 kΩ pull-down resistors connected to ground. Pin No. 12 is internally connected to a 930 kΩ pull-up resistor and is connected to the 5 volts input. Pin No. 13 has an input which is internally connected to a 930 kΩ pull-up resistor.

As noted, the X pulse is 180° out of phase with the Y pulse. This conserves power inasmuch as both pulse drives will not be high at the same time.

Figure 6:
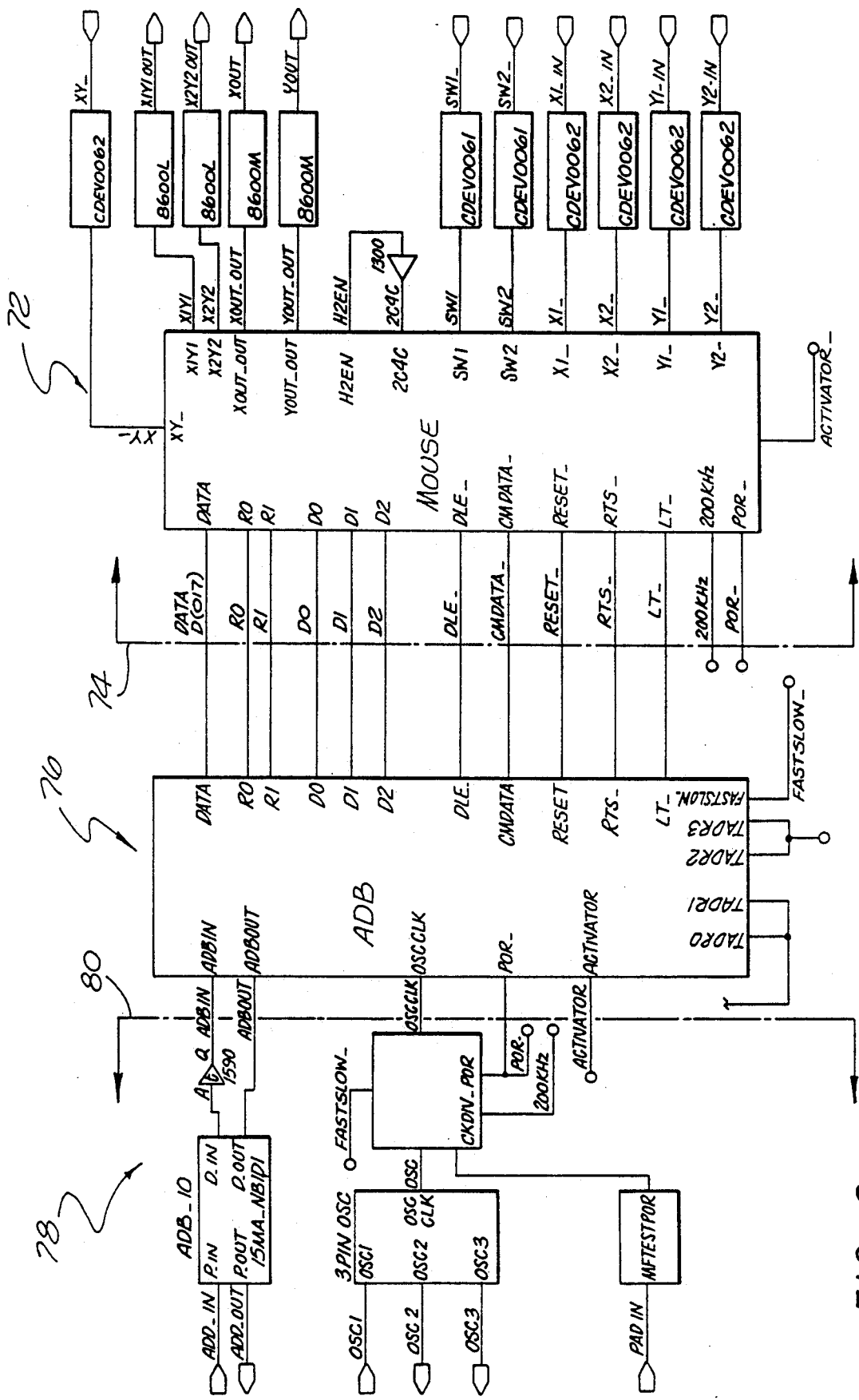
FIG. 6 is a block diagram of the application specific integrated circuit (ASIC) which may be used to implement the present invention.

Referring now to FIG. 6, a block diagram of the ASIC is illustrated. It can be seen that the chip can be viewed as three distinct portions. The mouse specific portion, designated generally as 72, to the right of dashed line 74, is the portion used for forming the desired pulses required for operation, as noted above, and will therefore be described in detail. Portion 76 illustrates the circuit for the data bus to the CPU and portion 78, to the left of dashed line 80, refers to the clock. Portions 76 and 78 will therefore not be discussed in detail.

The CDEV0061 input pad is used for the switch inputs, SW1_ and SW2_. The pad includes an inverting Schmitt input and 930 kΩ Pull-Up resistor.

The CDEV0062 input pad includes an inverting Schmitt Input and 70 kΩ Pull-Down resistor and is used as an input pad for the XY_, X1_IN, X2_IN, Y1_IN, and Y2_IN inputs The MFTESTPOR pad is an input pad for Power On Reset and Test Pad. It is used for the PADIN input pin.

The CDEV0063 Pad includes a 3 Pin Low Current R-C Oscillator. It is used as an input pin for the feedback resistor, as an output pin for the timing capacitor, and as an output pin for the timing resistor.

The 15MA-NBIDI pad is a 15 milliamp input/output pad used for the DB I/O data line.

The 8600 M pad is a non-inverting output buffer pad with medium drive current used for $X_{drive}$ and $Y_{drive}$.

The 8600 L pad is a non-inverting output buffer pad with low drive current used for test pins X1Y1$_{out}$ and X2Y2$_{out}$.

Figure 7:
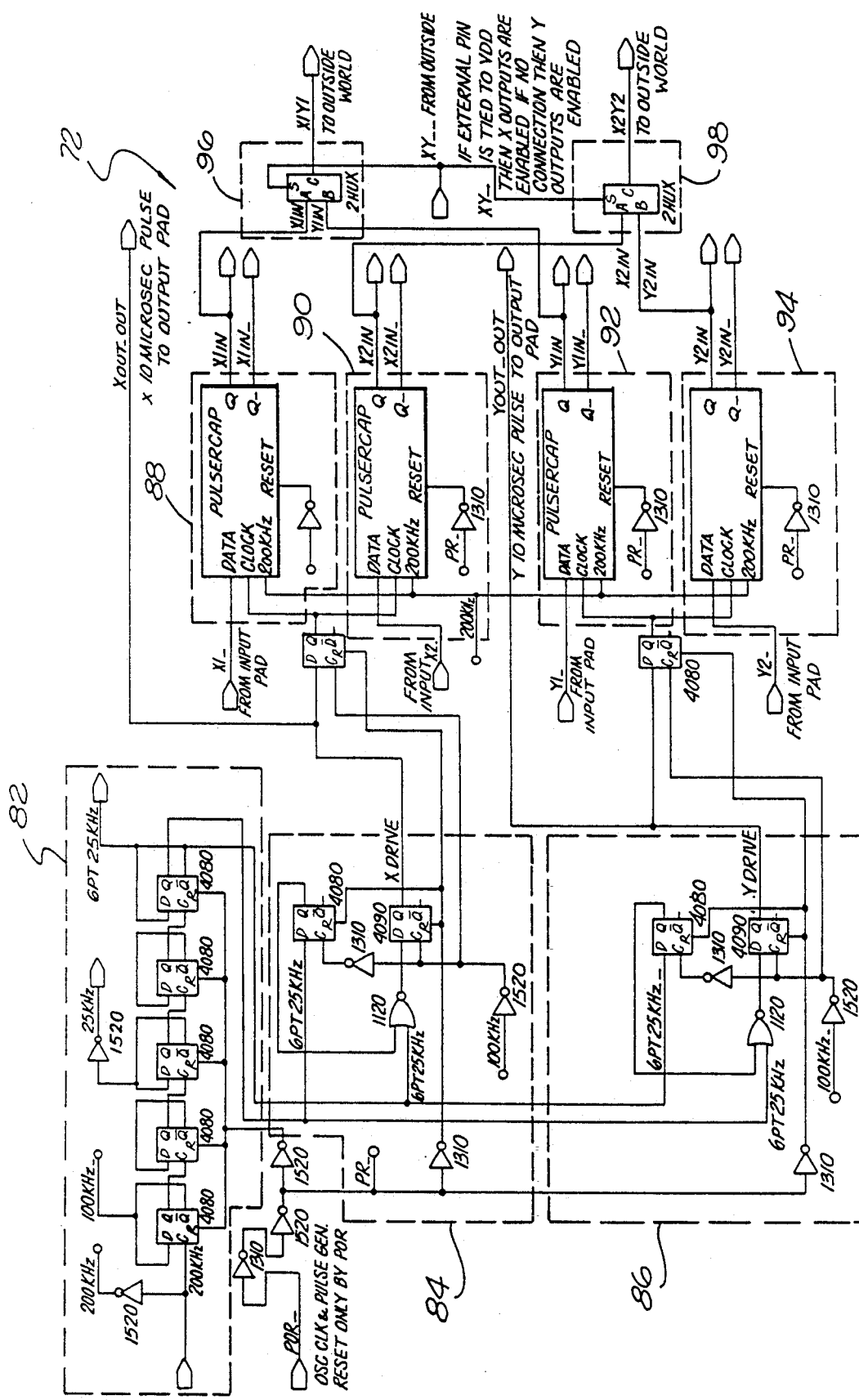
FIG. 7 is a logic diagram of a portion of the ASIC pertaining to the mechanism for performing the necessary pulse generation for the present invention.

FIG. 7 is a logic diagram of a portion 72 of the mouse portion of the ASIC which illustrates the mechanism for forming the necessary pulse generation. Referring to this figure, it can be seen that the mouse portion 72 of the ASIC 36 can be viewed in terms of modules designated by dashed lines, depending upon function. A clock divider, designated by dashed lines 82, functions to divide down the 200 Khz clock to a 100 Khz clock which is used for the $X_{drive}$ and $Y_{drive}$ pulses. The 100

Khz clock is used to create the 10 μS pulses, as illustrated in FIG. 5. The other relevant frequency from the clock divider is the 6.25 Khz frequency which creates the $X_{drive}$ and $Y_{drive}$ period of 160 μS.

The $X_{drive}$ module, designated by dashed lines 84, illustrates that the $X_{drive}$ is produced by clock frequencies of 6.25 Khz, 6.25 Khz bar, and 100 Khz; and by the circuitry illustrated. This circuitry creates a period of 160 μS and pulse of 10 μS.

The $Y_{drive}$ module, designated by dashed lines 86, illustrates that the $Y_{drive}$ is produced by clock frequencies of 6.25 Khz bar, 6.25 Khz and 100 Khz. This circuitry creates a period of 160 μS and pulse of 10 μS. $Y_{drive}$ is identical to $X_{drive}$ except it is 180° out of phase due to 6.25 Khz going into the NOR gate and 6.25 Khz bar going into the D-flip flop. ($X_{drive}$ has 6.25 Khz bar going into the NOR gate and 6.25 Khz going into the D-flip flop.) As noted, this phase difference provides minimized power consumption.

The four pulse recapture modules 88, 90, 92, 94 recapture the output from the phototransistors and form the quadrature waveforms, as described above. Modules 96, 98, represent test pins.

IV. Pin Reduction

Figure 8:
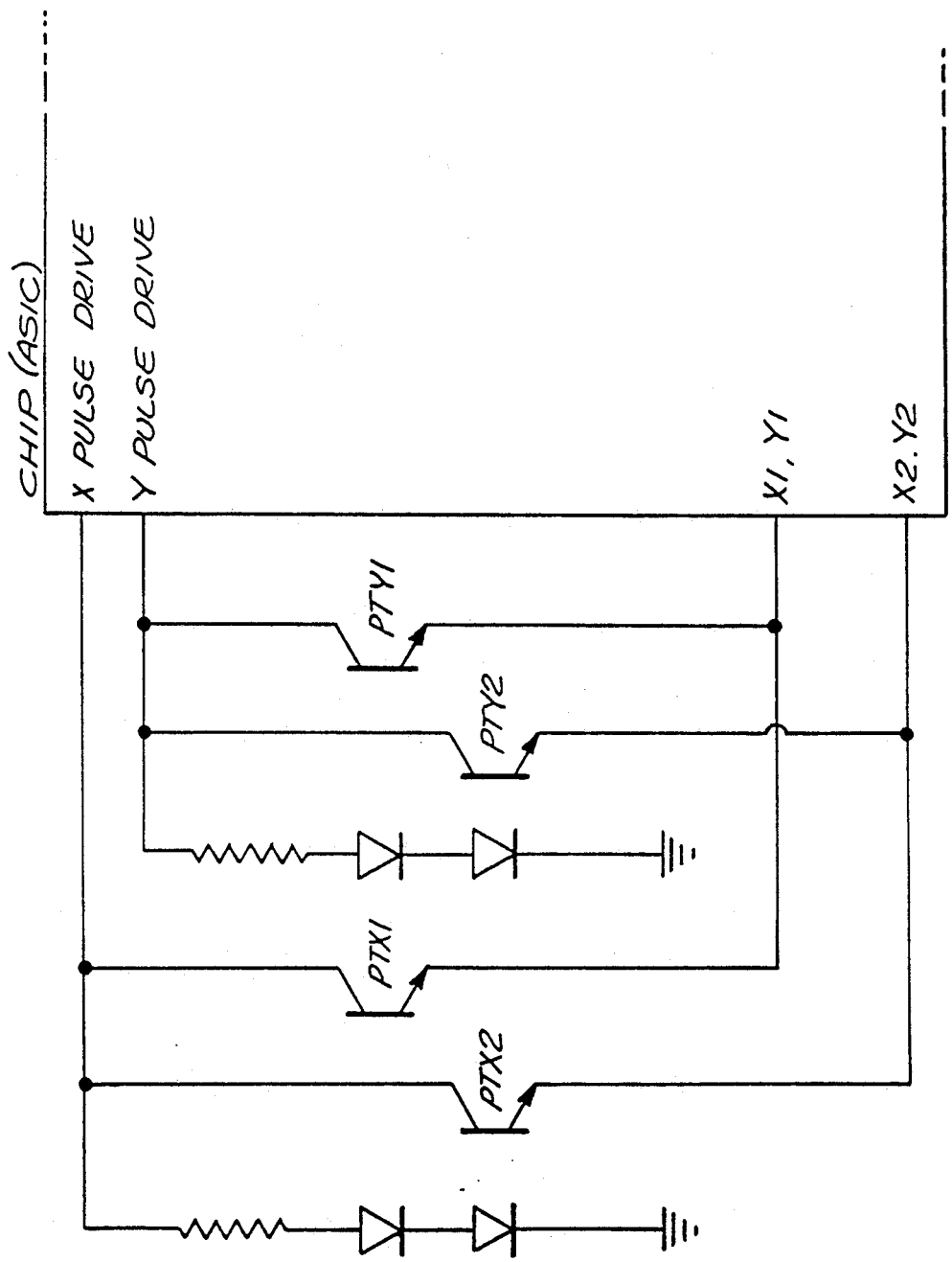
FIG. 8 is a diagram of a portion of an alternate embodiment of the present invention which uses an integrated circuit chip which allows for a reduction in the number of pins required.

Referring now to FIG. 8, a schematic illustration of another embodiment of the integrated circuit chip for providing the necessary pulse generation can be seen. This embodiment emphasizes that utilizing the inventive concepts of the present invention can allow for a reduction in the number of pins on the integrated circuit utilized. In the embodiment illustrated in FIG. 2, four input pins are required—Y2, Y1, X2 and X1. In the embodiment illustrated in FIG. 8, there are only two output pins—X1,Y1 and X2,Y2. This is possible because there is no discharge on the phototransistors and the horizontal and vertical phototransistors are pulsed 180° out of phase.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. An apparatus for optical encoding with respect to a first axis and a second axis, comprising:
   (a) a first axis assembly that includes:
      (1) first axis electrical input means for providing a first axis pulsed electrical signal;
      (2) a first light emitting device having a first path a light emission and having a first terminal coupled to the first axis electrical input means;
      (3) a second light emitting device coupled in series with the first light emitting device, wherein the second light emitting device has a second path of light emission and has a first terminal coupled to a second terminal of the first light emitting device;
      (4) a first photodetector residing in the first path of light emission and having a first terminal coupled to the first axis electrical input means such that when said first light emitting device goes to zero volts said first photodetector goes to zero volts in response to the first axis pulsed electrical signal;
      (5) a second photodetector residing in the second path of light emission and having a first terminal coupled to the first axis electrical input means such that when said second light emitting device goes to zero volts said second photodetector goes to zero volts in response to the first axis pulsed electrical signal;
      (6) first axis positionable light blocking means for blocking and unblocking the first path of light emission and for blocking and unblocking the second path of light emission;
   (b) a second axis assembly that includes:
      (1) second axis electrical input means for providing a second axis pulsed electrical signal, wherein the second axis pulsed electrical signal is substantially 180° out of phase with the first axis pulsed electrical signal;
      (2) a third light emitting device having a third path of light emission and having a first terminal coupled to the second axis electrical input means;
      (3) a fourth light emitting device coupled in series with the third light emitting device, wherein the fourth light emitting device has a fourth path of light emission and has a first terminal coupled to a second terminal of the third light emitting device;
      (4) a third photodetector residing in the third path of light emission and having a first terminal coupled to the second axis electrical input means such that when said third light emitting device goes to zero volts said third photodetector goes to zero volts in response to the second axis pulsed electrical signal;
      (5) a fourth photodetector residing in the fourth path of light emission and having a first terminal coupled to the second axis electrical input means such that when said fourth light emitting device goes to zero volts said fourth photodetector goes to zero volts in response to the second axis pulsed electrical signal;
      (6) second axis positionable light blocking means for blocking and unblocking the third path of light emission and for blocking and unblocking the fourth path of light emission;
   (b) encoding means having
      (1) a first input coupled to a second terminal of the first photodetector and a second terminal of the third photodetector and
      (2) a second input coupled to a second terminal of the second photodetector and a second terminal of the fourth photodetector.

2. The apparatus of claim 1 for optical encoding, wherein the first and second axes are orthogonal.

3. The apparatus of claim 1 for optical encoding, wherein the first axis is an X axis and the second axis is a Y axis.

4. The apparatus of claim 1 for optical encoding, wherein the light emitting device is a light emitting diode, and wherein the photodetector is a phototransistor.

5. A trackball for optical encoding with respect to a first axis and a second axis, comprising:
   (a) a first axis assembly that includes:
      (1) first axis electrical input means for providing a first axis pulsed electrical signal;
      (2) a first light emitting device having a first path of light emission and having a first terminal coupled to the first axis electrical input means;
      (3) a second light emitting device coupled in series with the first light emitting device, wherein the second light emitting device has a second path of light emission and has a first terminal coupled to a second terminal of the first light emitting device;

(4) a first photodetector residing in the first path of light emission and having a first terminal coupled to the first axis electrical input means such that when said first light emitting device goes to zero volts said first photodetector goes to zero volts in response to the first axis pulsed electrical signal;

(5) a second photodetector residing in the second path of light emission and having a first terminal coupled to the first axis electrical input means such that when said second light emitting device goes to zero volts said second photodetector goes to zero volts in response to the first axis pulsed electrical signal;

(6) first axis positionable light blocking means for blocking and unblocking the first path of light emission and for blocking and unblocking the second path of light emission;

(b) a second axis assembly that includes:

(1) second axis electrical input means for providing a second axis pulsed electrical signal, wherein the second axis pulsed electrical signal is substantially 180° out of phase with the first axis pulsed electrical signal;

(2) a third light emitting device having a third path of light emission and having a first terminal coupled to the second axis electrical input means;

(3) a fourth light emitting device coupled in series with the third light emitting device, wherein the fourth light emitting device has a fourth path of light emission and has a first terminal coupled to a second terminal of the third light emitting device;

(4) a third photodetector residing in the third path of light emission and having a first terminal coupled to the second axis electrical input means such that when said third light emitting device goes to zero volts said third photodetector goes to zero volts in response to the second axis pulsed electrical signal;

(5) a fourth photodetector residing in the fourth path of light emission and having a first terminal coupled to the second axis electrical input means such that when said fourth light emitting device goes to zero volts said fourth photodetector goes to zero volts in response to the second axis pulsed electrical signal;

(6) second axis positionable light blocking means for blocking and unblocking the third path of light emission and for blocking and unblocking the fourth path of light emission;

(c) encoding means having (1) a first input coupled to a second terminal of the first photodetector and a second terminal of the third photodetector and (2) a second input coupled to a second terminal of the second photodetector and a second terminal of the fourth photodetector.

6. The trackball of claim 5 for optical encoding, wherein the first and second axes are orthogonal.

7. The trackball of claim 5 for optical encoding, wherein the first axis is an X axis and the second axis is a Y axis.

8. The trackball of claim 5 for optical encoding, wherein the light emitting device is a light emitting diode, and wherein the photodetector is a phototransistor.

* * * * *